(12) United States Patent
Immonen et al.

(10) Patent No.: US 7,538,631 B2
(45) Date of Patent: May 26, 2009

(54) MULTI-MODE AMPLITUDE MODULATOR CONTROL METHOD

(75) Inventors: Antti Immonen, Helsinki (FI); Vlad Grigore, Espoo (FI)

(73) Assignee: Nokia Corporation, Espoo (FI)

( * ) Notice: Subject to any disclaimer, the term of this patent is extended or adjusted under 35 U.S.C. 154(b) by 144 days.

(21) Appl. No.: 11/707,886

(22) Filed: Feb. 20, 2007

(65) Prior Publication Data
US 2008/0157895 A1 Jul. 3, 2008

(30) Foreign Application Priority Data
Dec. 29, 2006 (FI) .................................. 20065865

(51) Int. Cl.
*H03C 1/00* (2006.01)
(52) U.S. Cl. .................. 332/149; 332/159; 332/160; 332/178
(58) Field of Classification Search ................. None
See application file for complete search history.

(56) References Cited

U.S. PATENT DOCUMENTS 6,300,826 B1 * 10/2001 Mathe et al. ................. 330/10
6,661,210 B2 * 12/2003 Kimball et al. .............. 323/268

* cited by examiner

*Primary Examiner*—Anh Q Tran
(74) *Attorney, Agent, or Firm*—Squire, Sanders & Dempsey L.L.P.

(57) ABSTRACT

A power management device providing a power amplifier with power supply voltage is provided. The power management unit includes a parallel-hybrid amplitude modulator apparatus having a linear part configured to track frequency components of an input signal above a determined threshold frequency and a switching part arranged in parallel with the linear part and configured to track frequency components of the input signal below the determined threshold frequency. Additionally, the power management unit includes a current sensing and controlling part configured to determine the level of a direct current component at an output of the linear part and control the switching part to produce an output signal compensating for the direct current component at the output of the linear part to decrease the absolute level of the direct current at the output of the linear part.

39 Claims, 3 Drawing Sheets

MULTI-MODE AMPLITUDE MODULATOR CONTROL METHOD

FIELD

The invention relates generally to radio devices and particularly to controlling a multi-mode amplitude modulator providing a power amplifier with power supply.

BACKGROUND

In radio transmitters, a transmission signal, i.e. the signal being transmitted, is amplified in a radio frequency power amplifier which amplifies the transmission signal to a level suitable for transmission over an air interface to a radio receiver. The level of the power-amplified transmission signal should be high enough to enable the radio receiver to decode information contained in the transmission signal.

In order to improve the power-efficiency of the power amplifier, a power supply voltage applied to the power amplifier is an amplitude-modulated signal adapted to track an envelope or an amplitude component of a radio frequency transmission signal amplified by the power amplifier. FIG. 1 illustrates a radio transmitter arrangement comprising a power amplifier 102 and a power management device 100 providing the power amplifier 102 with a power supply voltage Vpa. The power management device 100 receives a constant voltage Vbat from a battery, for example, and a reference signal Vref as inputs. The reference signal Vref may represent a transmission signal to be power amplified and transmitted and, accordingly, contain envelope or amplitude information of the transmission signal. The reference signal Vref may be a modulated information signal. The power management unit 100 may track the envelope (or power) of the transmission signal and output the power supply voltage accordingly.

A critical property of the power management device 100 is the bandwidth of the device 100. This bandwidth will determine, how accurately the power supply voltage Vpa follows the reference signal Vref and, thus, the efficiency of the power amplifier. Bandwidth requirements typically depend on telecommunication standards and transmitter architectures. In systems using Gaussian Minimum Shift Keying (GMSK), such as GSM, a radio frequency (RF) envelope is constant and, hence, there is no need for amplitude modulation of the power supply voltage. The dynamic requirements are set by the time in which the power supply voltage must be ramped-up and down between transmission slots. The required bandwidth is quite low, e.g. less than 100 kHz.

In EDGE (Enhanced Data Rates for GSM Evolution), in case of polar transmitter structures, the bandwidth should be higher than 1-1.5 MHz. In Wideband Code Division Multiple Access (WCDMA) systems, the strictest requirement would in the case of a polar transmitter structure, in which the bandwidth should be higher than 16 MHz. Regarding upcoming systems, e.g. 3.9 G, the understanding is that the bandwidth requirement will be in the order of 20 MHz in case of envelope tracking.

To cope with these requirements in terms of bandwidth, while having good power efficiency, a "parallel-hybrid" amplitude modulator has been proposed (U.S. Pat. No. 7,058, 373). In the parallel-hybrid topology, a switching part 202 is connected in parallel with a linear part 200, as illustrated in FIG. 2. The switching part 202 is slow, but can process a large power levels (high-level currents) with good efficiency. The switching part 202 typically processes a frequency interval 0 ... F1, where F1=1 MHz, for example.

The linear part 200 is fast, but has a low efficiency. The linear part 200 processes a frequency interval F1 ... F2, where F2=20 MHz, for example. In practice, there is a gradual transition band around frequency F1, where the power processing is handed over from the switching part 202 to the linear part 200.

In the parallel-hybrid amplitude modulator, the bandwidth is set according to the bandwidth of the linear part. Hence, it is possible to achieve large processing bandwidths. The overall efficiency depends on how much power must be processed by the switching part and how much by the linear part or, in other words, by the harmonic content of the reference signal Vref that must be tracked.

A problem associated to the parallel-hybrid topology is how to ensure the correct current sharing between the switching part and the linear part. In other words, how to control the two parts such they process only the frequency ranges that they were intended to? Ensuring correct current sharing is needed to maximize the efficiency because, as mentioned earlier, the efficiency of the linear part is low. The problem is similar regardless of whether a radio transmitter comprising the parallel hybrid amplitude modulator utilizes an envelope tracking power management device or a polar transmitter structure.

BRIEF DESCRIPTION OF THE INVENTION

An object of the invention is to provide a solution to the problem defined above.

According to an aspect of the invention, there is provided a parallel-hybrid amplitude modulator apparatus, comprising an interface to receive an input signal, a linear part configured to track frequency components of the input signal above a determined threshold frequency, a switching part arranged in parallel with the linear part and configured to track frequency components of the input signal below the determined threshold frequency, and a current sensing and controlling part configured to determine the level of a direct current component at an output of the linear part and control the switching part to produce an output signal compensating for the direct current component at the output of the linear part to decrease the absolute level of the direct current at the output of the linear part.

According to another aspect of the invention, there is provided a radio transmitter comprising the parallel-hybrid amplitude modulator apparatus according described above.

According to another aspect of the invention, there is provided a method, comprising: providing an output signal to track an input signal in a parallel-hybrid amplitude modulator comprising the linear part tracking frequency components of the input signal above a determined threshold frequency and a switching part tracking frequency components of the input signal below the determined threshold frequency, determining the level of a direct current component at an output of the linear part, and controlling the switching part to output an output signal compensating for the direct current component at the output of the linear part to decrease the absolute level of the direct current at the output of the linear part.

According to another aspect of the invention, there is provided a parallel-hybrid amplitude modulator apparatus, comprising means for receiving an input signal, linear means for tracking frequency components of the input signal above a determined threshold frequency, switching means arranged in parallel with the linear means and configured to track frequency components of the input signal below the determined threshold frequency, current sensing and controlling means for determining the level of a direct current component at an output of the linear means and control the switching means to produce an output signal compensating for the direct current component at the output of the linear part to decrease the absolute level of the direct current at the output of the linear means.

According to another aspect of the invention, there is provided a parallel-hybrid amplitude modulator apparatus, comprising an interface to receive an input signal, a linear part configured to track frequency components of the input signal above a determined threshold frequency, a switching part arranged in parallel with the linear part and configured to track frequency components of the input signal below the determined threshold frequency, a direct current voltage source providing at least the linear part with a direct current supply voltage, and a scaling unit configured to scale the direct current supply voltage to a level higher than a desired maximum output voltage of the parallel hybrid amplitude modulator to ensure the operation of the linear part with good efficiency.

According to another aspect of the invention, there is provided a parallel-hybrid amplitude modulator apparatus, comprising means for receiving an input signal, linear means for tracking frequency components of the input signal above a determined threshold frequency, switching means arranged in parallel with the linear means and configured to track frequency components of the input signal below the determined threshold frequency, direct current voltage supply means for providing at least the linear part with a direct current supply voltage, and scaling means for scaling the direct current supply voltage to a level higher than a desired maximum output voltage of the parallel hybrid amplitude modulator to ensure the operation of the linear means with good efficiency.

LIST OF DRAWINGS

In the following, the invention will be described in greater detail with reference to the embodiments and the accompanying drawings, in which FIG. 1 illustrates a block diagram comprising a power amplifier and a power management unit providing the power amplifier with power supply;

DESCRIPTION OF EMBODIMENTS

Figure 1:
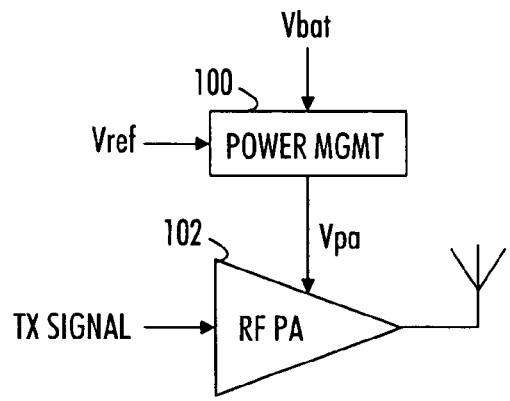
Figure 2:
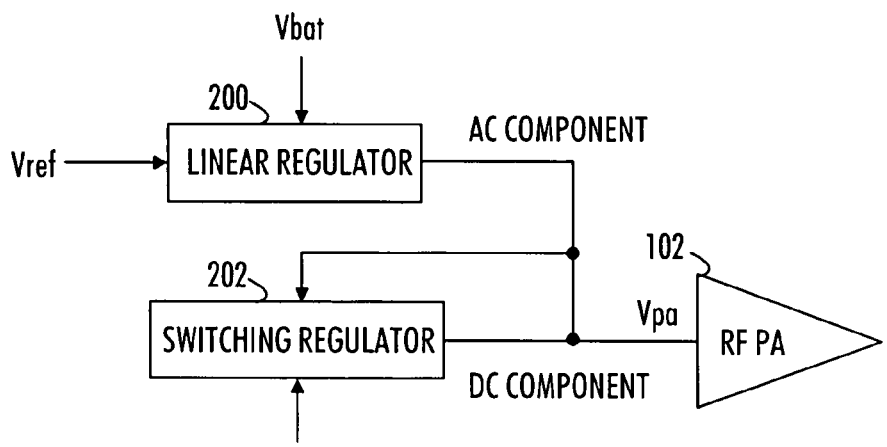
FIG. 2 illustrates a parallel-hybrid amplitude modulator utilized in the power management unit.

In principle, the efficiency of a parallel-hybrid amplitude modulator is optimum when an average output current, i.e. direct current (DC), of the linear part is zero. The overall efficiency would be severely degraded if the linear part would sink/source a DC component. Embodiments of the invention aim to control the switching part to compensate for the level of a DC component at an output of the linear part in order to minimize the absolute level of the average output current of the linear part, i.e. to prevent the linear part from becoming a source or a sink of DC current. In other words, the average output current of the linear part is minimized, i.e. kept as close to zero as possible. The basic structure of the parallel-hybrid amplitude modulator according to embodiments of the invention is similar to that illustrated in FIG. 2 but the embodiments comprise additional advantageous aspects. The parallel-hybrid amplitude modulator may form a switched-mode power supply providing a power amplifier of a radio transmitter with power supply voltage.

Figure 3:
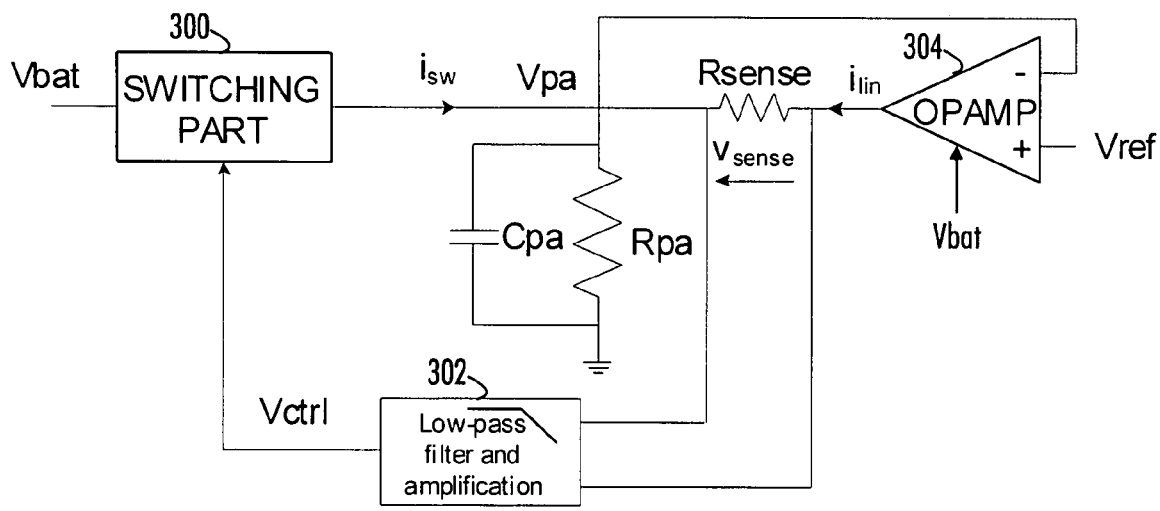
FIG. 3 illustrates a parallel-hybrid amplitude modulator according to an embodiment of the invention.

With reference to FIG. 3, examine an example of a parallel-hybrid amplitude modulator according to an embodiment of the invention. The linear part of the parallel-hybrid amplitude modulator comprises an operational amplifier 304 which receives a reference voltage (or signal) Vref to its non-inverted input. The reference voltage may represent the signal to be power-amplified in the power amplifier and transmitted from the radio transmitter. The reference voltage Vref may represent an envelope component or a power component of the signal to be power-amplified by the power amplifier. Alternatively, the embodiment of the invention may be utilized in a transmitter having a polar transmitter structure, in which case the reference voltage Vref input to the parallel-hybrid amplitude modulator may represent an amplitude component of a transmission signal to be power-amplified. An output of the operational amplifier 304 is connected to an inverted input of the operational amplifier, thus providing a feedback loop. The feedback loop of the operational amplifier 304 is in this embodiment configured to provide a unity gain, but it is also possible to configure the feedback loop with a gain larger than unity by arranging a resistor to be connected between the output of the operational amplifier 304 and the inverting input of the operational amplifier 304, and another resistor connected between the inverting input and ground. The ratio of these resistances will determine a gain larger than unity. The operational amplifier 304 may receive a supply voltage Vbat from a battery of the radio transmitter or from another direct current voltage source. The linear part, i.e. the operational amplifier 304, may output an output current $i_{lin}$ as a response to the input reference signal Vref and the feedback from the output of the linear part 304. In practice, the linear part tracks the voltage of the reference signal under the control of a feedback signal input through the feedback loop. The operational amplifier 304 may operate in class AB, for example.

In order to determine the level of DC component of the output current $i_{lin}$, a current-sensing resistor Rsense may be arranged in series with the output of the linear part and output of the parallel-hybrid amplitude modulator. The current sensing resistor Rsense may have a resistance low enough so that power dissipation does not become an issue, but high enough to enable measurement of voltage Vsense over the current-sensing resistor Rsense. The voltage. For example, the current-sensing resistor Rsense may be 100-200 mΩ. Alternatively, any other current-sensing component enabling the measurement of the output current of the linear part 304 may be utilized instead of the current-sensing resistor Rsense. The alternative current-sensing component may be a coil, for example.

In order to measure voltage Vsense over the current-sensing resistor Rsense, both ends of the current-sensing resistor Rsense may be connected to a controlling part 302 which may filter the input voltage signal Vsense with a low-pass filter to obtain an average value, i.e. the DC component, of the voltage Vsense over the current-sensing resistor Rsense. Obviously, the DC component of the voltage Vsense represents the level of the DC current flowing through the current-sensing resistor Rsense. In addition to low-pass filtering, the controlling part 302 may scale, i.e. amplify, the voltage signal Vsense, and output the scaled and low-pass filtered voltage signal as a control signal Vctrl to a switching part 300.

The switching part 300 may be a switching regulator based on Buck step-down, step-up, or step-up/down converter. The switching part 300 may receive a supply voltage Vbat from the battery or from another direct-current voltage source. The operation of the switching part 300 may be controlled by the control signal Vctrl received from the controlling part 302. The switching part 300 may be configured to track the control signal Vctrl in a determined manner. The switching part 300 may increase its output current $i_{sw}$ as a response to an increase in the control signal voltage Vctrl and decrease the output current $i_{sw}$ as a response to a decrease in the control signal voltage Vctrl.

The output of the switching part 300 may be connected to the output of the parallel-hybrid amplitude modulator. Accordingly, the outputs of the linear part 304 and the switching part 300 are connected to each other (through the current-sensing resistor Rsense). In fact, a positive value of the output current $I_{lin}$ of the linear part 304 increases the output current $I_{sw}$ of the switcher part 300, and an increase in the output current $i_{sw}$ of the switching part 300 decreases the level of current $i_{lin}$ output by the linear part 304, thereby decreasing the DC component output by the linear part 304 and preventing the linear part 304 from becoming a source of DC current. Correspondingly, a negative value of the output current $I_{lin}$ of the linear part 304 decreases the output current $I_{sw}$ of the switcher part 300, and a decrease in the output current $i_{sw}$ of the switching part 300 increases the level of current $i_{lin}$ output by the linear part 304 to increase the average current output by the linear part 304, thereby increasing the DC component output by the linear part 304 and preventing the linear part 304 from becoming a sink of DC current. The idea of the structure is to keep the DC component of the output current of the linear part 304 as close to zero as possible, thereby improving the efficiency of the linear part 304. In other words, the switching part 300 may be configured to adjust the level of its output signal proportionally to a change in the level of the direct current at the output of the linear part 304 to compensate for the change in the absolute level of the direct current at the output of the linear part 300.

The outputs of the linear part 304 and the switching part 300 may be connected to the power amplifier represented by a load in FIG. 3. An output voltage resulting from the summation of output currents of the linear part 304 and the switching part 300 is represented by Vpa in FIG. 3, and this output voltage Vpa is output to the load. The load comprises a load resistor Rpa and a load capacitor Cpa in parallel and connected to the ground at one end and to the output of the linear part 304 and the switching part 300. The load resistor Rpa may represent the equivalent DC resistance of a saturated power amplifier operating at a radio frequency (a radio frequency power amplifier). The load capacitor Cpa may be a decoupling capacitor that ensures the stability of the power amplifier. The power amplifier may be represented also in other ways, depending on the type of the power amplifier, its operating region, and on the desired level of modeling accuracy.

Figure 4:
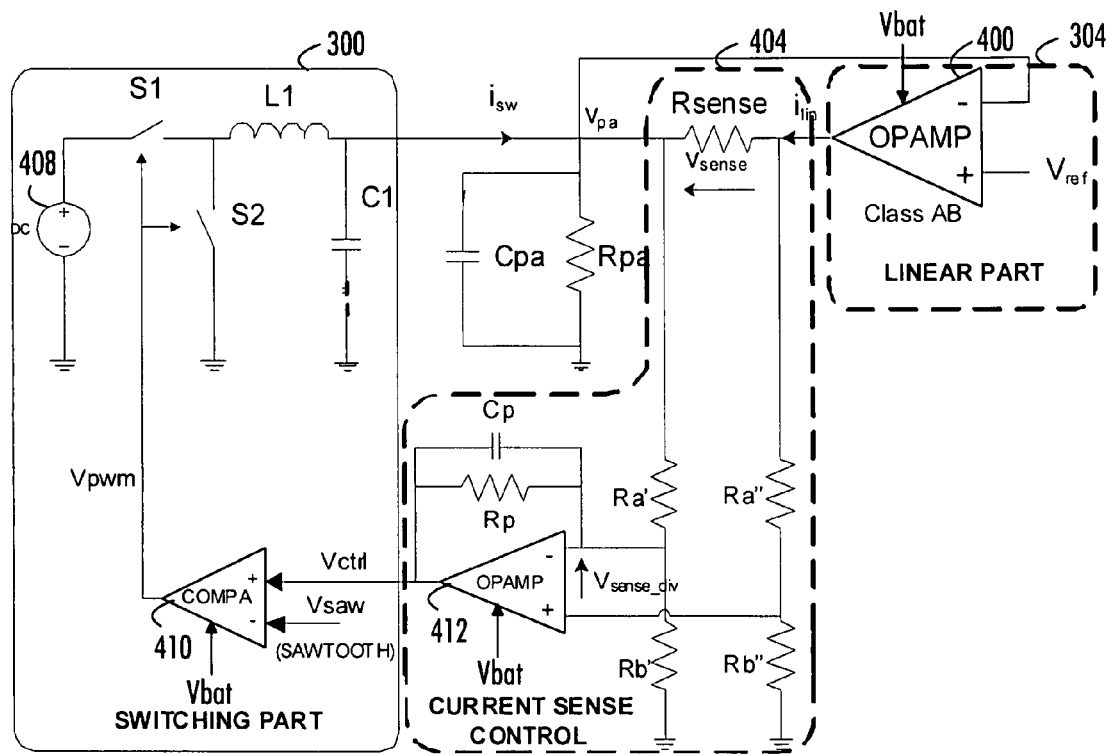
FIG. 4 illustrates a detailed block diagram of the parallel-hybrid amplitude modulator according to an embodiment of the invention.
Figure 5:
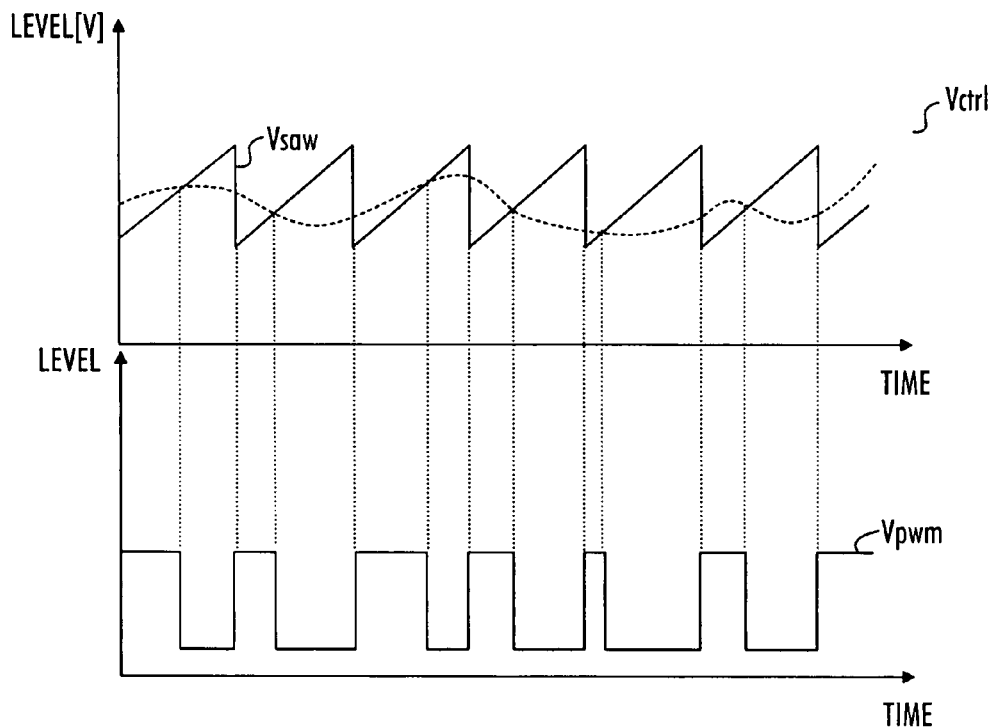
FIG. 5 illustrates an example of signals in the parallel-hybrid amplitude modulator according to an embodiment of the invention.

The operation of the parallel-hybrid amplitude modulator according to the embodiment described above with reference to FIG. 3 will now be described in more detail with reference to FIGS. 4 and 5. FIG. 4 illustrates a detailed diagram of the parallel-hybrid amplitude modulator according to the embodiment of the invention.

The linear part 304 comprises the operational amplifier 400 as described above. The current-sensing resistor Rsense belongs to a current sensing and controlling part 404 and forms a current sensing part. Other components may form a controlling part. The current sensing and controlling part 404 may additionally comprise an amplifier stage and a voltage-division stage as the controlling part. As mentioned above, both ends of the current-sensing resistor may be connected to the controlling part to obtain a signal representing the voltage Vsense over the current-sensing resistor Rsense. The ends of the current-sensing resistor Rsense may be connected to the voltage-division stage comprising four division resistors Ra', Rb', Ra", and Rb". An end of the current-sensing resistor Rsense connected to the operational amplifier 400 may be connected to a first division resistor Ra" which is connected from its other end to the ground through a second voltage division resistor Rb". A node between the first and the second division resistor Ra" and Rb" may be connected to a non-inverting input of an operational amplifier 412 belonging to the amplifier stage. The other end of the current-sensing resistor Rsense may be connected to a third division resistor Ra' which is connected from its other end to the ground through a fourth voltage division resistor Rb'. A node between the third and the fourth division resistor Ra' and Rb' may be connected to an inverting input of the operational amplifier 412. The operational amplifier 412 may use battery voltage Vbat or another positive DC supply voltage. The voltage-division stage may be used for scaling the voltages received through the ends of the current-sensing resistor Rsense to a voltage level suitable for a semiconductor process carried out in the operational amplifier 412 of the amplifier stage. The suitable voltage level may be between 0 and 2.5 V, for example.

The dividers Ra'/Rb" and Ra"/Rb" may advantageously be symmetrical. While the exact value of the resistors is not important, it would be advantageous that the dividers are symmetrical, i.e. the ratio of the first and the second division resistances Ra" and Rb" equals to that of the third and the fourth resistances Ra' and Rb', i.e. Ra'/Rb'=Ra"/Rb". This can be achieved in an integrated solution where, even if the absolute accuracy of the resistors may not be that accurate, their relative values may be defined very accurately. If the dividers are not symmetrical, this may result in a false non-zero voltage Vsense_div at the input of the operational amplifier 412, even if the voltage Vsense over the current-sensing resistor Rsense and, hence, the average value of $i_{lin}$ are zero. This would then have to be compensated for in order ensure desired functionality of the current sensing and controlling part 404.

The amplifier stage may have a low-pass filtering property arranged by providing appropriate components in a feedback loop of the operational amplifier. The feedback loop may be formed by connecting an output of the operational amplifier 412 to the inverting input. A resistor Rp and a capacitor $C_p$ may be arranged in parallel in the feedback loop of the amplifier 412. The low-pass filtering characteristics, i.e. a corner frequency of the low-pass filter, of the amplifier stage is determined by a pole defined by the resistor $R_p$ and the capacitance $C_p$ according to the following equation:

$$F_p = \frac{1}{2\pi R_p C_p} \quad (1)$$

The frequency Fp of the pole has impact on the range of frequencies that can be processed by the switching part 300. As explained above, the switching part 300 may process frequencies in interval 0 ... F1, and the linear part frequencies in interval F1 ... F2 (with a transition band around F1).

The frequency Fp of the pole may be either fixed or tunable. In the latter case, one of the elements that determine Fp may be tuned (e.g. by switching parallel-connected capacitors. This may allow a better adaptation to multimode operation (operation with multiple different radio access specifications), where e.g. the bandwidth requirements are very diverse.

A DC gain of the amplifier stage, on the other hand, is defined by the ratio of the resistor $R_p$ and the first division resistor Ra' as $R_p$/Ra'.

Accordingly, there is a scaled voltage Vsense_div over the inputs of the operational amplifier 412, the scaled voltage Vsense_div still representing the current flowing through the current-sensing resistor Rsense. The amplifier stage then scales (amplifies) and low-pass filters the voltage Vsense_div to obtain an average value of the voltage over the current-sensing resistor to represent DC current flowing through the current-sensing resistor Rsense. The amplifier stage then outputs a control signal voltage Vctrl to the switching part 300.

As mentioned above, the switching part 300 may be based on Buck step-down regulator DC-DC converter topology. Accordingly, the switching part 300 may comprise a power supply unit 408 providing a DC voltage, which may be the battery or another DC voltage supply, a comparator 410, switches S1 and S2, a sawtooth signal generator (not shown), an inductance L1 and a capacitor C1. The capacitance of the capacitor C1 may be small. In fact, the capacitor C1 may even be merged with the load capacitance Cpa, if desired. A compensator circuit comprising an operational amplifier and a compensation network of a conventional DC-DC switching regulator may be omitted in this embodiment. The filter structure formed by the inductance L1 and the capacitor C1 is a second order filter structure in this description, but it may obviously be of higher order (for example fourth order having two inductances and two capacitors).

The comparator 410 may receive the control signal voltage Vctrl from the current sensing and controlling part 404 and a sawtooth signal Vsaw from the sawtooth signal generator as input signals. Additionally, the comparator may receive supply voltage from the battery or from another DC voltage supply. In FIG. 5, the control signal voltage Vctrl is illustrated by a dashed line and the sawtooth signal Vsaw is illustrated by a solid line. Additionally, the comparator 410 may receive a supply voltage Vbat from the battery. The comparator 410 may be configured to compare the control signal voltage Vctrl with the sawtooth signal voltage Vsaw and output an output signal Vpwm representing the result of the comparison. The output signal may have two values, i.e. two voltage levels, depending on which of the control signal voltage Vctrl and the sawtooth signal voltage Vsaw have a higher current voltage level. If the level of the control signal voltage Vctrl is higher than the level of the sawtooth signal voltage Vsaw, the comparator may output a high-level output signal Vpwm. On the contrary, if the level of the control signal voltage Vctrl is lower than the level of the sawtooth signal voltage Vsaw, the comparator may output a low-level output signal Vpwm. As a result, the output signal Vpwm becomes a pulse-width modulated square wave signal, as illustrated in FIG. 5 as solid line in the lower diagram.

The pulse-width modulated square wave signal Vpwm output by the comparator 410 may be used for controlling the switches S1 and S2. A first switch S1 may be disposed between the power supply unit 408 and the inductance L1, and a second switch S2 may be disposed to have one end connected between the first switch S1 and the inductance L1 and the other end connected to the ground. The first switch S1 may be adapted to be closed when the level of the output signal Vpwm of the comparator 410 is high, and the second switch S2 may be adapted to be closed when the level of the output signal Vpwm of the comparator 410 is low.

When the level of the output signal Vpwm of the comparator 410 is high, the first switch S1 connects the power supply unit 408 to the inductance L1 and, accordingly, the output voltage provided by the switching part 300 is increased. On the other hand, when the level of the output signal Vpwm of the comparator 410 is low, the first switch S1 disconnects the power supply unit 408 from the inductance L1 and the second switch S2 connects the inductance L1 to the ground. Accordingly, the output voltage provided by the switching part 300 is proportional to the duty-cycle of the pulse width modulated signal Vpwm. Let us remind, that the switching part 300 is used for tracking the lowest frequency components of the input reference signal Vref.

Let us now consider two cases in which the embodiment prevents the linear part 304 from becoming a source or sink of DC current. In the first case, the average value of the output current $i_{lin}$ of the linear part 304 becomes positive and increases. Accordingly, the linear part 304 becomes a source of DC current. As a result, the voltage over the current-sensing resistor Rsense increases, thereby causing an increase in the control signal voltage Vctrl. The increase in the control signal voltage Vctrl, on the other hand, causes an increase in the duty-cycle of the output signal Vpwm of the comparator, which means that the level of the pulse-width modulated signal Vpwm remains high for longer periods. Accordingly, the power supply unit 408 is connected to the inductance L1 for longer periods of time, thereby causing an increase in the output voltage and the output current $i_{sw}$ supplied by the switching part 300. As a consequence, the voltage over the current sensing resistor Rsense decreases due to increased voltage from the switching part 300 side of the resistor Rsense, thus compensating for the initial increase in the average value of the output current $i_{lin}$ of the linear part 304.

In the second case, the average value of the output current $i_{lin}$ of the linear part 304 becomes negative and decreases. Accordingly, the linear part 304 becomes a sink of DC current. As a result, the voltage over the current-sensing resistor Rsense decreases to a negative value, thereby causing a decrease in the control signal voltage Vctrl. The decrease in the control signal voltage Vctrl, on the other hand, causes a decrease in the duty-cycle of the output signal Vpwm of the comparator, which means that the level of the pulse-width modulated signal Vpwm remains low for longer periods. Accordingly, the power supply unit 408 is connected to the inductance L1 for shorter periods of time and to the ground for longer periods of time, thereby causing a decrease in the output voltage and the output current is W supplied by the switching part 300. As a consequence, the voltage over the current sensing resistor Rsense increases towards zero due to the decreased voltage from the switching part 300 side of the resistor Rsense, thus compensating for the initial decrease in the average value of the output current $i_{lin}$ of the linear part 304.

The embodiment described above is robust and insensitive to noise The low-pass filtering property extracts the DC component of the output current $i_{lin}$ of the linear part 304 which ensures an accurate measurement of the output current $i_{lin}$.

The current-sensing resistor Rsense does not have to be a precision resistor. Since an accurate instantaneous measurement of the $i_{lin}$ current is not needed (only the average value), the exact value of the current-sensing resistor Rsense is not that important. This is a big advantage, especially for an integrated solution, because an accurate trimming of the current-sensing resistor Rsense is not necessary.

The DC gain of the operational amplifier 412 is advantageously high. The output of the current sensing and controlling part Vctrl should be in the range of the sawtooth signal Vsaw, e.g. 0 . . . 2.5V. Assuming that the resistance of the current-sensing resistor Rsense is 200 mΩ, and the maximum acceptable value of the output current $i_{lin}$ of the linear part 304 is 10 mA, this results into a maximum voltage Vsense of 2 mV. Therefore, the DC gain of the operational amplifier 412 should be 2.5/0.002=1250=62 dB. This will be even higher if the resistance of Rsense is lower and/or the maximum accepted average value of $i_{lin}$ is lower.

It is possible to tune the output current $i_{lin}$ of the linear part 304 to be zero, if needed. In practice the average value of $i_{lin}$ is never zero (very small, but not zero). This is not a problem, as a small DC component of $i_{lin}$ does not have a significant impact on the efficiency of the linear part. The reason for the non-zero average $i_{lin}$ is due to the fact that the control signal voltage Vctrl should have a DC component to fit into the dynamic range of the sawtooth signal Vsaw, and because the gain of the operational amplifier 412 is finite. However, if a very close to zero average current $i_{lin}$ is desired, this can be achieved by making the division resistors Ra'/Rb' and Ra"/Rb" slightly asymmetrical. By doing so, it is possible to have zero output current $i_{lin}$ of the linear part and, hence, zero voltage Vsense over the current-sensing resistor, resulting in a non-zero scaled voltage Vsense_div due to slightly asymmetrical dividers over the inputs of the operational amplifier 412 of the amplifier stage. Obviously, this results in a non-zero control signal voltage Vctrl.

The switching frequency of the switching part 300 may be fixed, if desired. In practice, the saw tooth signal provided by the saw tooth signal generator has a fixed frequency. The switching frequency of the switching part 300 may also be semi-fixed in order to provide flexibility for multimode operation. In more detail, the switching frequency may be changed when changing a transmission mode of the radio transmitter, e.g. when changing from EDGE transmission to W-CDMA transmission. Within one transmission mode, the switching frequency may be kept fixed. Alternatively, the switching frequency may be changed within one transmission mode to provide even more flexibility to the operation. In fact, the switching part 300 may be formed from a portion of a conventional switching regulator working at constant switching frequency which may be 10 MHz, for example.

As mentioned in the background section, the linear part 304 is configured to track the input signal Vref at frequencies above a determined threshold frequency F1. Correspondingly, the switching part 300 is configured to track the input signal Vref at frequencies below the threshold frequency F1. A transition band may be provided around the threshold frequency in which the tracking is transferred from the switching part 300 to the linear part. The threshold frequency F1 may be made tunable to provide more flexibility. In other words, frequency bands of the linear part 304 and the switching part may be made adaptive. In some cases, it may be advantageous to allocate a higher frequency band to the switching part 300 than in other cases to ensure an efficient operation of the parallel hybrid amplitude modulator.

As can be seen from the description above, the switching part 300 of the parallel-hybrid amplitude modulator functions as a slave of the linear part 304 in the sense that the operation of the switching part 300 depends on the output current $i_{lin}$ of the linear part 304.

The present current-sensing based control method of the parallel-hybrid amplitude modulator is able to cope with different types of signals, which makes it suitable for a multimode power amplification power management device. The present parallel-hybrid topology works well even in WCDMA radio transmitters, which is a very challenging case due to extremely high variations in the amplitude of a transmission signal. The present parallel-hybrid amplitude modulator is naturally capable of tracking an input reference signal Vref having only a DC component. For example in multi-mode transmitters supporting several transmission schemes requiring different properties from transmitted signal, the parallel-hybrid amplitude modulator may have to control only the DC component in constant envelope transmission (GSM GMSK modulation, for example) and use amplitude modulation in variable-envelope transmission (EDGE and WCDMA, for example).

Figure 6:
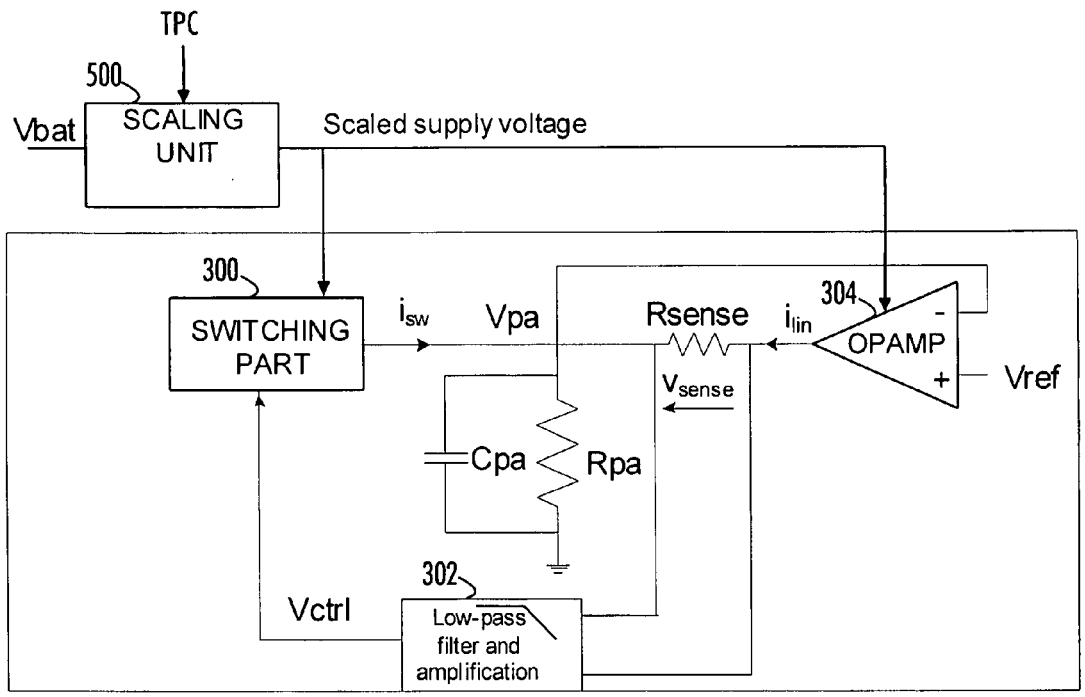
FIG. 6 illustrates a block diagram of a further improvement of parallel-hybrid amplitude modulator illustrated in FIGS. 3 and 4.

FIG. 6 illustrates an embodiment of the invention which further improves the efficiency of the parallel-hybrid amplitude modulator described above. The problem of power management systems containing any linear amplifiers is relatively low efficiency at low output voltage levels. This is mainly due to the fact that the efficiency of any linear amplifier is very low at low voltages. WCDMA modulation, in particular, is troublesome for the linear amplifier due to the high bandwidth. A problem is also that the output voltage ripple of the DC-DC converter is at highest level when the duty cycle (output voltage/supply voltage Vbat) is around 50%. Moreover, the efficiency is very essential parameter in RF systems and in battery-operated radio transmitters such as mobile communication devices.

In the embodiment illustrated in FIG. 6, the parallel-hybrid amplitude modulator described above has been provided with a scaling unit 500 configured to scale the direct current supply voltage Vbat to a level higher than a desired maximum output voltage Vpa of the parallel hybrid amplitude modulator to ensure the operation of the amplitude modulator with high efficiency. An input of the scaling unit 500 may be connected to the power supply unit (the battery, for example) to receive the power supply voltage Vbat. Additionally, the scaling unit may receive a control signal controlling the scaling unit 500 in the scaling operation. The control signal may be provided by a processing unit of a radio transmitter comprising the parallel-hybrid amplitude modulator, the scaling unit 500 and the processing unit, and the processing unit may determine the control signal from received transmit power control commands defining the absolute transmission power of the radio transmitter. The transmit power control commands may be received from another radio transmitter communicating with the radio transmitter considered herein. The transmit power control commands may be part of transmit power control procedure known in mobile telecommunication systems. The scaling unit 500 may be adapted to scale the input power supply voltage Vbat according to the transmit power control commands such that a scaled supply voltage output by the scaling unit 500 is a determined amount higher than a desired maximum output voltage of the parallel hybrid modulator. Alternatively, the scaling unit 500 may be configured to receive the transmit power control commands and comprise a logic to determine an appropriate scaling factor from the received transmit power control commands. The scaling performed by the scaling unit 500 may be a downscaling operation in which the scaling unit scales the input voltage into a lower voltage level.

The minimum scaled supply voltage output by the scaling unit 500 may be around 2.5v in order to keep the devices supplied with the scaled supply voltage working properly.

Otherwise, the scaled supply voltage may be, for example, 200 to 300 mV higher than the desired maximum output voltage of the parallel hybrid modulator to ensure an efficient operation of the devices.

The scaling unit 500 may output the scaled supply voltage only to the linear part 304 of the parallel-hybrid amplitude modulator, or to both linear part 304 and the switching part 300. Since the efficiency of the linear part 304 is lower than that of the switching part 300, it may be advantageous to scale the supply voltage of at least the linear part 304 to improve its efficiency. Efficiency of the switching part 300 may also be improved by scaling the supply voltage of the switching part 300.

The scaling unit 500 may be a low-bandwidth step-up and/or step-down DC-DC converter, i.e. a switching regulator, or any other device capable of scaling DC voltage to a desired voltage level and adjusting the scaling factor as a response to changes in a desired transmit power level of the radio transmitter.

Figure 7:
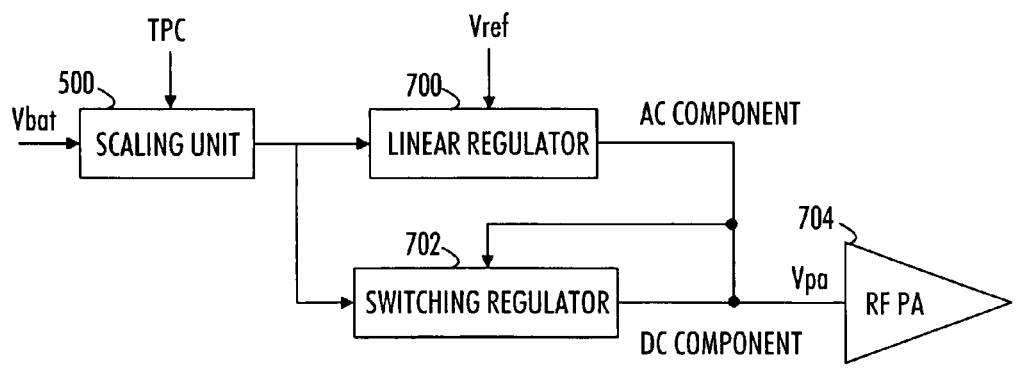
FIG. 7 illustrates a parallel-hybrid amplitude modulator according to another embodiment of the invention.

The scaling unit 500 described above may be arranged to scale the supply voltage of the linear part 304 and the switching part 300 belonging to the embodiment of the invention described above and relating to the current-sensing control of the linear part 304. However, the scaling unit may be implemented in a radio transmitter utilizing another type of parallel-hybrid amplitude modulator. In other words, the scaling unit is not dependent on the current-sense based control scheme described above. FIG. 7 illustrates an embodiment in which the scaling unit 500 is employed in a conventional parallel-hybrid amplitude modulator tracking the envelope or an amplitude component of a transmission signal and providing a power amplifier 704 with power supply voltage.

The scaling unit 500 may operate as described above and scale the DC supply voltage Vbat down to a level higher than a desired maximum output voltage Vpa of the parallel hybrid amplitude modulator to ensure the operation of the amplitude modulator with high efficiency. The scaled DC supply voltage may be 200 to 300 mV higher than the desired maximum output voltage Vpa still not being lower than a limit set by the applicable IC manufacturing process (for example 2.5v). The scaled supply voltage may then be supplied to a linear regulator 700 tracking high frequency components of a received reference signal Vref, i.e. the envelope or an amplitude component of the transmission signal. Additionally, the scaled supply voltage may be supplied also to a switching regulator 702 tracking low frequency components of the received reference signal Vref.

Embodiments of the invention may be implemented in a power management device included in a radio transmitter. The power management device may be configured to track the envelope or an amplitude component of a transmission signal and provide a power amplifier with power supply voltage according to variations in the envelope (or amplitude) of the transmission signal in order to improve the efficiency of the power amplifier carrying out power amplification of the transmission signal to be transmitted from the radio transmitter. The radio transmitter may be battery-operated mobile radio transmitter such as a mobile communication device communicating with a radio access network of a mobile telecommunication system.

Even though the invention has been described above with reference to an example according to the accompanying drawings, it is clear that the invention is not restricted thereto but it can be modified in several ways within the scope of the appended claims.

What is claimed is:

1. A parallel-hybrid amplitude modulator apparatus, comprising:
    an interface configured to receive an input signal;
    a linear part configured to track frequency components of the input signal above a determined threshold frequency;
    a switching part arranged in parallel with the linear part and configured to track frequency components of the input signal below the determined threshold frequency,
    wherein the linear part and the switching part are configured to track a varying amplitude of the input signal; and
    a current sensing and controlling part configured to determine a level of a direct current component at an output of the linear part and control the switching part to produce an output signal configured to compensate the direct current component at the output of the linear part to decrease a absolute level of the direct current at the output of the linear part.

2. The apparatus of claim 1, wherein the current sensing and controlling part comprises,
    a current-sensing component connected to the output of the linear part, and
    a control section configured to obtain a signal representing a voltage over the current-sensing component and filter the signal representing the voltage over the current-sensing component with a low-pass filter to obtain a signal representing the level of the direct current at the output of the linear part.

3. The apparatus of claim 2, wherein the control section is further configured to scale the signal representing the voltage over the current-sensing component to a desired range suitable for carrying out the control of the switching part.

4. The apparatus of claim 2, wherein the control section comprises an amplifier circuit connected to both ends of the current-sensing component and having a low-pass filtering property, and configured to provide the signal representing the level of the direct current at the output of the linear part as a control signal to the switching part.

5. The apparatus of claim 1, wherein the switching part is configured to adjust a level of the output signal proportionally to a change in the level of the direct current at the output of the linear part, and an output of the switching part is connected to an output of the linear part to compensate for the change in the absolute level of the direct current at the output of the linear part.

6. The apparatus of claim 1, wherein the switching part comprises,
    a saw-tooth signal generator configured to generate a saw-tooth signal having a fixed frequency,
    a comparator having a first input connected to the saw-tooth signal generator and a second input connected to an output of the current sensing and controlling part, the comparator being configured to compare levels of input signals and output a square wave signal that is pulse-width modulated according to results of comparison,
    a direct current voltage source configured to provide direct current, and
    a switch section controlled by the output signal of the comparator and configured to couple the direct current voltage source to an output of the switching part.

7. The apparatus of claim 6, wherein the switching part further comprises,
    at least one inductance coupled between the direct current voltage source and the output of the switching part, and
    at least one capacitance coupled between the at least one inductance and a ground level.

8. The apparatus of claim 7, wherein the switch section comprises,
a first switch provided between the at least one inductance and the direct current voltage source and configured to be closed in response to a first level of an output signal of the comparator, and
a second switch having one end connected between the first switch and the at least one inductance and the other end connected to the ground level and, being configured to be closed in response to a second level of the output signal of the comparator, the second level being different from the first level.

9. The apparatus of claim 6, wherein the comparator is configured to output an output signal having a first level, when the input signal received from the current sensing and controlling part is higher than a signal received from the saw-tooth generator, and output an output signal having a second level different from the first level, when the input signal received from the current sensing and controlling part is lower than the signal received from the saw-tooth generator.

10. The apparatus of claim 1, wherein the input signal is applied to a first input of the linear part and the switching part is adapted to function as a slave with respect to the linear part.

11. The apparatus of claims 1, wherein the output of the linear part and the switching part are coupled with each other and with a load, and the linear part comprises a feedback from the output to one of inputs of the linear part.

12. The apparatus of claim 11, wherein the linear part is implemented by an operational amplifier having a feedback from the output of the operational amplifier to one input of the operational amplifier and the input signal applied to another input of the operational amplifier.

13. The apparatus of claim 1, further comprising:
a direct current voltage source providing at least the linear part with a direct current supply voltage, and
a scaling unit configured to scale the direct current supply voltage to a level higher than a desired maximum output voltage of the parallel hybrid amplitude modulator to ensure an operation of the linear part with good efficiency.

14. The apparatus of claim 13, wherein the scaling unit is adapted to receive the desired maximum output voltage of the parallel hybrid amplitude modulator as an input control signal.

15. The apparatus of claim 13, wherein the scaling unit is further configured to scale the supply voltage of the switching part.

16. The apparatus of claim 1, wherein the determined threshold frequency is adjustable.

17. A radio transmitter comprising a parallel-hybrid amplitude modulator apparatus, comprising:
an interface configured to receive an input signal;
a linear part configured to track frequency components of the input signal above a determined threshold frequency;
a switching part arranged in parallel with the linear part and configured to track frequency components of the input signal below the determined threshold frequency,
wherein the linear part and the switching part are configured to track a varying amplitude of the input signal; and
a current sensing and controlling part configured to determine a level of a direct current component at an output of the linear part and control the switching part to produce an output signal configured to compensate the direct current component at the output of the linear part to decrease an absolute level of the direct current at the output of the linear part.

18. The radio transmitter of claim 17, further comprising a power amplifier configured to power-amplify a transmission signal according to a received power supply voltage, and the parallel-hybrid amplitude modulator apparatus is configured to provide the power amplifier with the power supply voltage.

19. A method, comprising:
providing an output signal to track an input signal in a parallel-hybrid amplitude modulator comprising a linear part tracking frequency components of the input signal above a determined threshold frequency and a switching part tracking frequency components of the input signal below the determined threshold frequency,
wherein the linear part and the switching part are configured to track a varying amplitude of the input signal;
determining a level of a direct current component at an output of the linear part; and
controlling the switching part to output an output signal compensating for the direct current component at the output of the linear part to decrease an absolute level of the direct current at the output of the linear part.

20. The method of claim 19, further comprising:
providing a current-sensing component connected to an output of the linear part;
obtaining a signal representing a voltage over the current-sensing component; and
low-pass filtering the signal representing the voltage over the current-sensing component to obtain a signal representing the level of the direct current at the output of the linear part.

21. The method of claim 20, further comprising:
scaling the signal representing the voltage over the current-sensing component to a desired range suitable for carrying out the control of the switching part.

22. The method of claim 19, wherein the switching part is controlled to adjust a level of the output signal proportionally to a change in the level of the direct current at an output of the linear part, the method further comprising:
applying the output signal of the switching part to the output of the linear part, thereby compensating for the change in the level of the direct current at the output of the linear part to decrease the absolute level of the direct current at the output of the linear part.

23. The method of claim 19, further comprising:
comparing, in the switching part, the determined level of the direct current at the output of the linear part with a saw-tooth signal provided by a saw-tooth signal generator to provide a square wave signal being pulse-width modulated according to results of comparison, wherein the saw-tooth signal has a fixed frequency; and
coupling a direct current voltage source of the switching part to an output of the switching part as a response to the pulse-width modulated square wave signal.

24. The method of claim 23, further comprising:
coupling the direct current voltage source of the switching part to an output of the switching part through at least one inductance; and
providing at least one capacitance between the at least one inductance and a ground level.

25. The method of claim 24, further comprising:
coupling the voltage source through the at least one inductance to the output of the switching part in response to a first level of the output signal of the comparator; and
coupling the at least one inductance to the ground in response to a second level of the output signal of the comparator, the second level being different from the first level.

26. The method of claim 23, wherein the comparison comprises providing a signal having a first level, when the determined level of the direct current at the output of the linear part is higher than the saw-tooth signal, and providing a signal having a second level different from the first level when the determined level of the direct current at the output of the linear part is lower than the saw-tooth signal.

27. The method of claim 19, wherein the input signal is applied to a first input of the linear part and the switching part is adapted to function as a slave with respect to the linear part.

28. The method of claim 19, further comprising:
inputting the input signal to an input of the linear part;
combining the outputs of the linear part and the switching part to provide an output signal to be applied as a supply voltage to a power amplifier; and
feeding the output signal back to an input of the linear part to control an operation of the linear part.

29. The method of claim 19, further comprising:
providing at least the linear part with a direct current supply voltage; and
scaling the direct current supply voltage to a level higher than a desired maximum output voltage of the parallel hybrid amplitude modulator to ensure the operation of the linear part with good efficiency.

30. The method of claim 29, further comprising:
determining the desired maximum output voltage of the parallel hybrid amplitude modulator from received transmit power control commands.

31. The method of claim 29, further comprising:
scaling the supply voltage of the switching part.

32. The method of claim 19, wherein the determined threshold frequency is adjustable.

33. A parallel-hybrid amplitude modulator apparatus, comprising:
receiving means for receiving an input signal;
linear means for tracking frequency components of the input signal above a determined threshold frequency;
switching means arranged in parallel with the linear means and configured to track frequency components of the input signal below the determined threshold frequency,
wherein the linear means and the switching means are configured to track a varying amplitude of the input signal; and
current sensing and controlling means for determining a level of a direct current component at an output of the linear means and control the switching means to produce an output signal compensating for the direct current component at the output of the linear part to decrease an absolute level of the direct current at the output of the linear means.

34. A parallel-hybrid amplitude modulator apparatus, comprising:
an interface configured to receive an input signal;
a linear part configured to track frequency components of the input signal above a determined threshold frequency;
a switching part arranged in parallel with the linear part and configured to track frequency components of the input signal below the determined threshold frequency;
a direct current voltage source configured to provide at least the linear part with a direct current supply voltage, and
a scaling unit configured to scale the direct current supply voltage to a level higher than a desired maximum output voltage of the parallel hybrid amplitude modulator to ensure an operation of the linear part with good efficiency.

35. The apparatus of claim 34, wherein the scaling unit is configured to receive the desired maximum output voltage of the parallel hybrid amplitude modulator as an input control signal.

36. The apparatus of claim 34, wherein the scaling unit is further configured to scale also the supply voltage of the switching part.

37. A parallel-hybrid amplitude modulator apparatus, comprising:
receiving means for receiving an input signal;
linear means for tracking frequency components of the input signal above a determined threshold frequency;
switching means arranged in parallel with the linear means and configured to track frequency components of the input signal below the determined threshold frequency;
direct current voltage supply means for providing at least the linear part with a direct current supply voltage; and
scaling means for scaling the direct current supply voltage to a level higher than a desired maximum output voltage of the parallel hybrid amplitude modulator to ensure the operation of the linear means with good efficiency.

38. A method, comprising:
receiving an input signal;
tracking, with a linear part, frequency components of the input signal above a determined threshold frequency;
tracking, with a switching part, frequency components of the input signal below the determined threshold frequency,
providing a direct current supply voltage; and
scaling the direct current supply voltage to a level higher than a desired maximum output voltage of a parallel hybrid amplitude modulator to ensure an operation of the linear part with good efficiency.

39. The method of claim 38, further comprising:
receiving the desired maximum output voltage of the parallel hybrid amplitude modulator as an input control signal.

* * * * *